US012729124B2

(12) United States Patent
Ashizawa et al.

(10) Patent No.: US 12,729,124 B2
(45) Date of Patent: Sep. 8, 2026

(54) COMPOSITE STRUCTURE AND SEMICONDUCTOR MANUFACTURING APPARATUS INCLUDING COMPOSITE STRUCTURE

(71) Applicant: TOTO LTD., Kitakyushu (JP)

(72) Inventors: Hiroaki Ashizawa, Kitakyushu (JP); Ryoto Takizawa, Kitakyushu (JP); Yuki Sunaba, Kitakyushu (JP)

(73) Assignee: Toto, Ltd., Fukuoka (JP)

( * ) Notice: Subject to any disclaimer, the term of this patent is extended or adjusted under 35 U.S.C. 154(b) by 157 days.

(21) Appl. No.: 18/730,039

(22) PCT Filed: Feb. 13, 2023

(86) PCT No.: PCT/JP2023/004710
§ 371 (c)(1),
(2) Date: Jul. 18, 2024

(87) PCT Pub. No.: WO2023/162743
PCT Pub. Date: Aug. 31, 2023

(65) Prior Publication Data

US 2025/0270099 A1 Aug. 28, 2025

(30) Foreign Application Priority Data

Feb. 26, 2022 (JP) ................................. 2022-028739
Feb. 26, 2022 (JP) ................................. 2022-028740
Feb. 26, 2022 (JP) ................................. 2022-028741

(51) Int. Cl.
*C01B 33/20* (2006.01)
*H01J 37/32* (2006.01)

(52) U.S. Cl.
CPC .......... *C01B 33/20* (2013.01); *C01P 2002/60* (2013.01); *C01P 2002/72* (2013.01);
(Continued)

(58) Field of Classification Search
CPC .. C01B 33/20; C01P 2002/60; C01P 2002/74; C01P 2004/03; C01P 2006/90; H01J 37/32495; H10P 72/7616
See application file for complete search history.

(56) References Cited

U.S. PATENT DOCUMENTS 7,090,932 B2 8/2006 Kobayashi et al.
2018/0339938 A1 11/2018 Bellman et al.
(Continued)

FOREIGN PATENT DOCUMENTS

CN 106116698 A 11/2016
CN 113584417 A 11/2021
(Continued)

OTHER PUBLICATIONS

Notice of Allowance dated Jan. 27, 2026 issued in the corresponding Korean Patent Application 20247020805.
(Continued)

*Primary Examiner* — Donald M Flores, Jr.
(74) *Attorney, Agent, or Firm* — Carrier, Shende & Associates P.C.; Joseph P. Carrier; Fulchand P. Shende

(57) ABSTRACT

Disclosed is a composite structure having low-particle generation usable for a member for a semiconductor manufacturing apparatus and also the semiconductor manufacturing apparatus. The composite structure including a base material and a structure that is provided on the base material wherein the structure comprises $Y_2SiO_5$ crystal as a main component, and lattice constants of the crystal satisfy at least one of a>9.06, b>6.93, and c>6.70 or an peak intensity ratio (300)/(121) which is the ratio of (300) peak to (121) peak in X-ray diffraction of the crystal, is greater than 100% has low-particle generation and is suitably used as a member for a semiconductor apparatus.

20 Claims, 5 Drawing Sheets

(52) U.S. Cl.
CPC ...... *C01P 2002/74* (2013.01); *C01P 2004/03* (2013.01); *C01P 2004/61* (2013.01); *C01P 2006/90* (2013.01); *H01J 37/32495* (2013.01)

(56) References Cited

U.S. PATENT DOCUMENTS

| | | | |
|---|---|---|---|
| 2019/0382880 | A1 | 12/2019 | He et al. |
| 2020/0185203 | A1 | 6/2020 | Lubomirsky et al. |
| 2021/0265140 | A1* | 8/2021 | Tanaka ............. H01J 37/32467 |

FOREIGN PATENT DOCUMENTS

| | | | |
|---|---|---|---|
| JP | H11-157916 | A | 6/1999 |
| JP | 2001-031466 | A | 2/2001 |
| JP | 2001-206764 | A | 7/2001 |
| JP | 2005-060827 | A | 3/2005 |
| JP | 2005-097685 | A | 4/2005 |
| JP | 2008-260651 | A | 10/2008 |
| JP | 2020-521709 | A | 7/2020 |
| JP | 2021-177542 | A | 11/2021 |
| KR | 10-2259919 | B1 | 6/2021 |
| KR | 2021-0087558 | A | 7/2021 |
| WO | 2020/004563 | A1 | 1/2020 |

OTHER PUBLICATIONS

Office Action mailed on Feb. 7, 2026 issued in corresponding Japanese Patent Application No. 2022-028741.

Office Action mailed on Jun. 15, 2026 issued in the corresponding Taiwanese Patent Application.

* cited by examiner

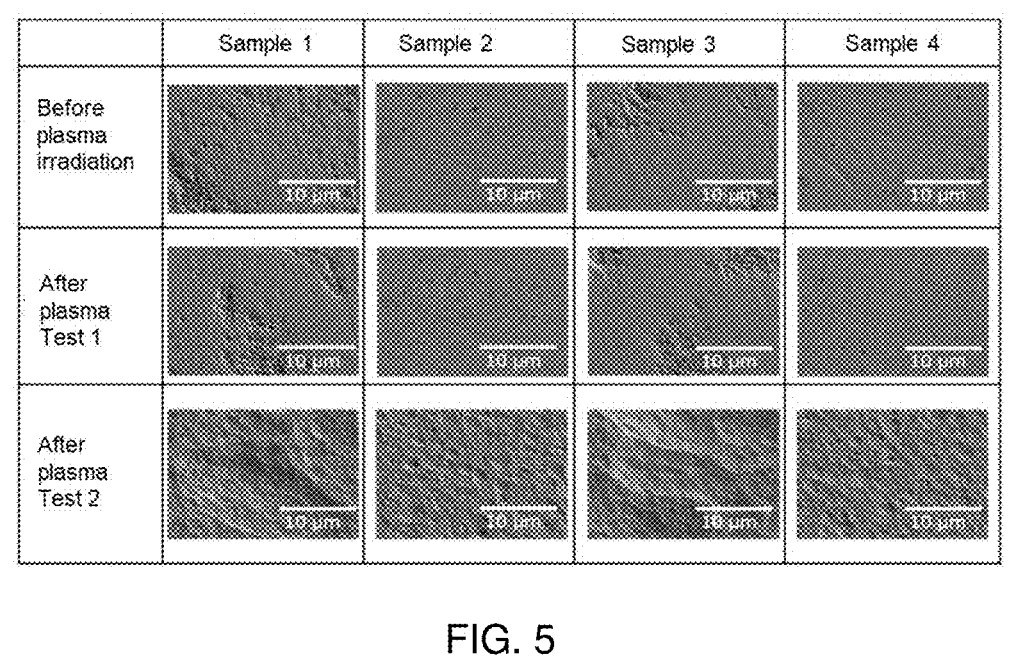

| | Sample 1 | Sample 2 | Sample 3 | Sample 4 |
|---|---|---|---|---|
| Before plasma irradiation | 10 μm | 10 μm | 10 μm | 10 μm |
| After plasma Test 1 | 10 μm | 10 μm | 10 μm | 10 μm |
| After plasma Test 2 | 10 μm | 10 μm | 10 μm | 10 μm |

FIG. 5

COMPOSITE STRUCTURE AND SEMICONDUCTOR MANUFACTURING APPARATUS INCLUDING COMPOSITE STRUCTURE

TECHNICAL FIELD

The present invention relates to a composite structure which is excellent in an anti-particle property (low-particle generation property) to be suitably used as a member for a semiconductor manufacturing apparatus, and a semiconductor manufacturing apparatus including the same.

BACKGROUND ART

There has been known a technology with which a substrate is imparted with a function by means of coating a surface thereof with a ceramics. For instance, as a member for a semiconductor manufacturing apparatus used under a plasma exposure environment, a member having highly plasma resistant coating formed on its surface has been used. As the coating, for example, oxide-based ceramics such as alumina ($Al_2O_3$) or yttria ($Y_2O_3$), or fluorides such as yttrium fluoride ($YF_3$) or yttrium oxyfluoride (YOF) is used.

It has also been proposed to use $Y_2SiO_5$ based materials as components that require plasma resistance (PTL 1 and PTL 2). However, these prior art documents do not disclose or suggest any relationship between the plasma resistance of $Y_2SiO_5$ based materials and their lattice constants. Furthermore, these prior art documents do not disclose or suggest any relationship between the plasma resistance of $Y_2SiO_5$ based materials and a specific peak ratio or indentation hardness in X-ray crystal diffraction.

Due to miniaturization of semiconductors, a higher level of low-particle generation has been required for various members in the semiconductor manufacturing apparatus and the materials that can meet this requirement remain in demand.

CITATION LIST

PLT 1: JP 2001-206764 A
PLT 2: JP 2005-60827 A

SUMMARY OF INVENTION

Technical Problem

We have now found that in a $Y_2SiO_5$ based material, by making the lattice constant of it larger than the value that it normally has, fluorination can be suppressed in a fluorine plasma environment. We also have found that in a $Y_2SiO_5$ based material, by making a specific peak ratio of X-ray crystal diffraction a specific value, fluorination can be suppressed in a fluorine plasma environment. Furthermore, we also have found that in a $Y_2SiO_5$ based material, by controlling the indentation hardness of it, fluorination can be suppressed in a fluorine plasma environment. The present invention is based on these findings.

Thus, an object of the present invention is to provide a composite structure with excellent low-particle generation. A further object is to enable such a composite structure to be used as a member of a semiconductor manufacturing apparatus and to provide a semiconductor manufacturing apparatus using the same.

A composite structure according to one embodiment of the present invention comprising: a base material; and a structure provided on the base material and has a surface, wherein the structure comprises $Y_2SiO_5$ crystal as a main component and lattice constants of the crystal satisfy at least one of a>9.06, b>6.93, and c>6.70.

A composite structure according to one embodiment of the present invention comprising: a base material; and a structure provided on the base material and has a surface, wherein the structure comprises $Y_2SiO_5$ crystal as a main component, and an peak intensity ratio (300)/(121) which is the ratio of (300) peak to (121) peak in X-ray diffraction of the crystal, is greater than 100%.

A composite structure according to one embodiment of the present invention comprising: a base material; and a structure provided on the base material and has a surface, wherein the structure comprises $Y_2SiO_5$ crystal as a main component, and has an indentation hardness of more than 7.5 GPa.

The composite structure according to the present invention can be used in an environment requiring low-particle generation.

A semiconductor manufacturing apparatus according to the present invention includes the composite structure according to the present invention described above.

BRIEF DESCRIPTION OF DRAWINGS

FIG. 5 is SEM images of the surface of the structures of the present invention after Standard Plasma Test 1 or 2.

DESCRIPTION OF EMBODIMENTS

Composite Structure

Figure 1:
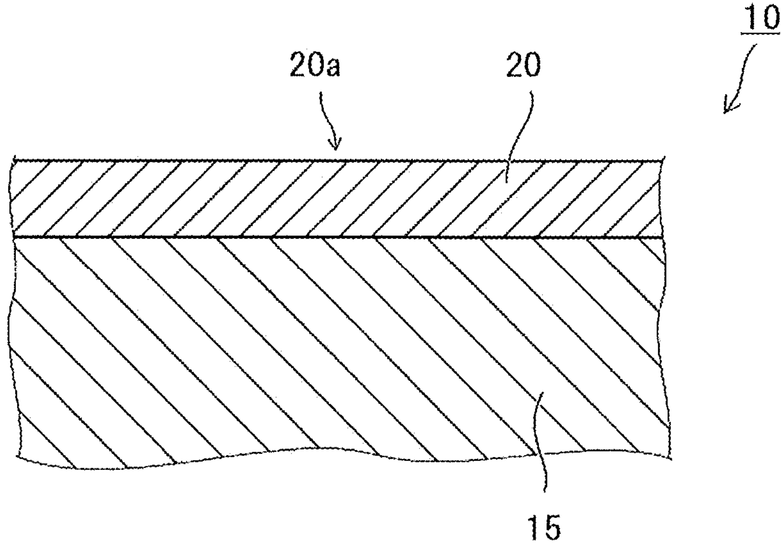
FIG. 1 is a schematic-cross sectional view of a member including a structure of the present invention. The composite structure 10 includes a structure 20 provided on a base material 15, and the structure 20 has a surface **20*a*** that is exposed to the plasma environment.

A basic structure of a composite structure according to the present invention will be described with reference to FIG. 1. FIG. 1 is a schematic cross-sectional view of a composite structure 10 according to the present invention. The composite structure 10 includes a structure 20 provided on a base material 15, and the structure 20 has a surface **20*a***.

The structure 20 of the composite structure of the present invention is what is known as a ceramic coating. With the ceramic coating provided, the base material 15 can have various physical properties/characteristics. The structure (or the ceramic structure) and the ceramic coating are synonymously used herein unless noted otherwise.

For example, the composite structure 10 is provided inside a chamber of a semiconductor manufacturing apparatus including the chamber. The composite structure 10 can constitute inner wall of the chamber. Fluorine based gas, such as SF based gas or CF based gas, is introduced into the chamber to generate plasma, whereby the surface **20*a* of the structure 20 is exposed to the plasma environment. Thus, low-particle generation is required for the structure 20 at the surface of the composite structure 10**. The composite structure of the present invention may be used as a member mounted to a part other than the inside of the chamber. In this specification, the semiconductor manufacturing apparatus for which the composite structure according to the present invention is used is meant to include any semiconductor manufacturing apparatus (semiconductor processing apparatus) executing processing such as annealing, etching, sputtering, or CVD.

Base Material

In the present invention, the base material 15, which is not particularly limited as long as it is used for its purpose, is configured to include alumina, quartz, anodized aluminum (alumite), metal, or glass, and is preferably configured to include alumina. According to a preferred embodiment of the present invention, an arithmetic average roughness Ra (JISB0601:2001) of a surface of the base material 15 on which the structure 20 is formed is, for example, less than 5 micrometers (μm), preferably less than 1 μm, and is more preferably less than 0.5 μm.

Structure

The structure of the present invention includes $Y_2SiO_5$ crystal as a main component.

In the present invention, the main component of the structure is a compound that is contained in the structure 20 by an amount relatively larger than those of other compounds, as identified by quantitative or semi-quantitative analysis with X-ray diffraction (XRD). For example, the main component is a compound that is contained in the largest amount in the structure, and the proportion of the main component in the structure is 70 wt % or more, preferably 90% wt % or more, and most preferably 100%, by mass ratio.

The component that may be included in the structure of the present invention in addition to the $Y_2SiO_5$ includes an oxide such as scandium oxide, europium oxide, gadolinium oxide, erbium oxide, or ytterbium oxide, and a fluoride such as yttrium fluoride or yttrium oxyfluoride. Furthermore, two or more, that is, a plurality of these may be included.

In the present invention, the structure is not limited to a single layer structure, and may be a multilayer structure. A plurality of layers having $Y_2SiO_5$ crystal of different compositions as main components may be included. A different layer, a layer including $Y_2O_3$ for example may be provided between the base material and the structure.

Lattice Constant

According to one embodiment of the present invention, the $Y_2SiO_5$ crystal contained in the structure has a lattice constant that satisfies at least one of a>9.06, b>6.93, and c>6.70, and preferably has a lattice constant that satisfies at least one of a≥9.10, b≥6.94, and c≥6.73, thereby suppressing fluorination of the structure and improving particle resistance.

ICDD card (reference code: 01-070-5613), the lattice constants of $Y_2SiO_5$ are a=9.01 (Å), b=6.93 (Å), and c=6.64 (Å), and the present invention is characterized in that at least one of the lattice constants a, b, and c has a value exceeding these values.

In the present invention, the lattice constant is measured using XRD. For example, the XRD device is "Smart Lab/available from Rigaku" and the measurement conditions of XRD are CuKα (λ=1.5418 Å), tube voltage 45 kV, tube current 200 mA, sampling step 0.01°, and scan speed 10.0°/min. For example, the XRD analysis software "Smart-Lab Studio II/available from Rigaku" is used, and the obtained XRD diffraction pattern is identified as a monoclinic crystal of the chemical formula $Y_2SiO_5$ shown in ICDD card 01-070-5613. Next, the lattice constant is calculated by refining the lattice constant using the external standard method using the XRD analysis software "Smart-Lab Studio II/available from Rigaku". Metallic Si is used as the external standard, and the following peaks are designated for use in calculating the lattice constant: a peak at a diffraction angle 2θ=16.4° assigned to Miller indices (hkl)=(110), a peak at a diffraction angle 2θ=20.6° assigned to Miller indices (hkl)=(200), a peak at a diffraction angle 2θ=31.1° assigned to Miller indices (hkl)=(300), a peak at a diffraction angle 2θ=32.5° assigned to Miller indices (hkl)=(121), a peak at a diffraction angle 2θ=33.7° assigned to Miller indices (hkl)=(310), a peak at a diffraction angle 2θ=46.3° assigned to Miller indices (hkl)=(321), and a peak at a diffraction angle 2θ=48.8° assigned to Miller indices (hkl)=(123). Since the structure of the present invention is a new structure having lattice constants a=9.0139 and c=6.6427, the peak positions (2θ) assigned to each Miller index (hkl) actually measured by XRD are shifted to a lower angle side by 0.1 to 0.4° from the theoretical peak positions (26) assigned to each Miller index (hkl). Other lattice constants can be measured in accordance with JIS K0131.

Peak Intensity Ratio

According to one embodiment of the present invention, the peak intensity ratio (300)/(121), which is the ratio of the (300) peak to the (121) peak in the X-ray diffraction of the $Y_2SiO_5$ crystal contained in the structure, is preferably greater than 100%, and more preferably greater than 110%.

The peak intensity ratio can be measured using XRD. The XRD device used is "Smart Lab/available from Rigaku", and the XRD measurement conditions are CuKα (lambda=1.5418 Å) characteristic X-rays, 45 kV tube voltage, 200 mA tube current, 0.01° sampling step, and 10.0°/min scan speed. The peak intensity ratio (300/(121) is calculated from the peak intensity at the diffraction angle 2θ=32.5°±0.4 (32.1° to 32.9°) assigned to Miller index (hkl)=(121) in the monoclinic crystal of $Y_2SiO_5$, and the peak intensity at the diffraction angle 2θ=31.1°±0.4° (30.7° to 31.5°) assigned to Miller index (hkl)=(300). Since the structure in the present invention is a novel structure having lattice constants a=9.0139 and c=6.6427, the peak positions (2θ) assigned to each Miller index (hkl) actually measured by XRD are shifted to a lower angle side by 0.1 to 0.4° from the theoretical peak positions (2θ) assigned to each Miller index (hkl).

Indentation Hardness

According to one embodiment of the present invention, the structure contains the $Y_2SiO_5$ crystal as a main component and has an indentation hardness of more than 7.5 GPa. This improves particle resistance. The indentation hardness is more preferably 10 GPa or more. The upper limit of the indentation hardness is not particularly limited and may be determined depending on the required characteristics, but is, for example, 18 GPa or less.

The indentation hardness of the structure is measured by the following method. The hardness measurement is performed by a microindentation hardness test (nanoindentation) on the surface of the structure containing the $Y_2SiO_5$ crystal as a main component on the substrate. The indenter is a Berkovich indenter, the indentation depth is a fixed value of 200 nm, and the indentation hardness (indentation hardness) $H_{IT}$ is measured. The surface is selected as the measurement point of the $H_{IT}$ on the surface excluding scratches and dents. More preferably, the surface is a polished smooth surface. The number of measurement points is at least 25 points or more. The average value of the $H_{IT}$ measured at 25 points or more is the hardness in the present invention. Other test methods and analysis methods, procedures for verifying the performance of the test device, and conditions required for the standard reference sample are in accordance with ISO14577.

Etching Rate and Fluoride Content

The composite structure according to the present invention can suppress fluorination in a fluorine plasma environment and also suppress etching by the plasma.

According to one embodiment of the present invention, after Standard Plasma Test 1 that is described later, a surface roughness Sa (determined according to ISO 25178) of the structure is less than 0.06 μm, preferably less than 0.03 μm. This provides good anti-particle property.

In the present invention, the tests for exposure to fluorine-based plasma defined below will be referred to as Standard Plasma Tests 1 and 2, respectively.

Plasma Exposure Conditions

For structures containing the $Y_2SiO_5$ crystal as a major component on a substrate, the surface is exposed to a plasma environment using an Inductively Coupled Plasma Reactive Ion Etching (ICP-RIE) apparatus. The plasma environment is formed under the following two conditions.

Standard Plasma Test 1:

Process gas: $SF_6$ 100 sccm, Power output: 1500 W of ICP coil output and Bias output: 750 W.

Standard Plasma Test 2:

Process gas: $SF_6$ 100 sccm, Power output: 1500 W of ICP coil output and Bias output: OFF (0 W). Thus, no application to biasing radio frequency power of an electrostatic chuck.

Standard Plasma Tests 1 and 2 are also performed under the common conditions that chamber pressure is 0.5 Pa and that plasma exposure time is one hour. A member for the semiconductor manufacturing apparatus is arranged on a silicon wafer sucked by the electrostatic chuck of the ICP-RIE apparatus to expose the structure surface to the plasma atmosphere formed under such conditions.

Crystallite Size

According to an embodiment of the present invention, the $Y_2SiO_5$ crystal is polycrystalline. Its average crystallite size is preferably less than 50 nm, more preferably less than 30 nm, and most preferably less than 20 nm. The small average crystallite size allows for smaller particles generated by the plasma.

In this specification, "polycrystal" refers to a structure composed of crystal particles joined and accumulated. It is preferable that the crystalline particles constitute a crystal substantially by themselves. The diameter of the crystal particles is, for example, 5 nanometers (nm) or more.

In the present invention, the crystallite size is measured by, for example, X-ray diffraction. The average crystallite size can be calculated by the Scherrer formula.

Manufacturing of Composite Structure

The composite structure according to the present invention can be manufactured by a variety of versatile production methods as long as the structure with the above lattice constants can be realized on the base material. That is, it may be manufactured by a method that can form a structure containing the $Y_2SiO_5$ crystal as a main component and having the above-mentioned lattice constant on a base material, such as physical vapor deposition (PVD), chemical vapor deposition (CVD), etc. A structure can be formed on a substrate by. Examples of PVD methods include electron beam physical vapor deposition (EB-PVD), ion beam assisted deposition (IAD), electron beam ion assisted deposition (EB-IAD), ion plating, sputtering, and the like. Examples of CVD methods include thermal CVD, plasma CVD (PECVD), metal organic CVD (MOCVD), mist CVD, laser CVD, and atomic layer deposition (ALD). According to another aspect of the invention, it can be formed by arranging fine particles including a brittle material on a surface of a base material, and applying mechanical impact force on the fine particles. Here, a method of "applying mechanical impact force" includes: using a high-speed rotating brush or roller with high hardness or a piston moving up and down at high speed; using compressive force due to shockwaves produced by explosion; applying ultrasonic waves; or a combination of these.

The composite structure according to the present invention can be preferably manufactured by aerosol deposition (AD method). This "AD method" is a method including the following procedures. Specifically, "aerosol" with the fine particles including the brittle material such as ceramics dispersed in gas is injected toward the base material through a nozzle, to make the fine particles collide with a base material such as metal, glass, ceramics, or plastic at high speed. The fine particles including the brittle material are deformed and crushed through the impact of the collision. As a result, the particles are bonded to each other, whereby a structure (ceramic coat) including a component of the fine particles is formed directly on the base material, to be a layer-shaped structure or a film-shaped structure for example. With this method, no heating means, cooling means, or the like is required in particular, the structure can be formed at a normal temperature, and a structure having a mechanical strength that is equal to or greater than that of a sintered body can be obtained. The density, the mechanical strength, electric property, and the like of the structure can be changed in various ways, by controlling matters such as the condition under which the fine particles collide and the shape and composition of the fine particles. Then, the composite structure according to the present invention can be manufactured by setting various conditions so as to realize the composite structure according to the present invention, that is, to obtain the lattice constant according to the present invention. For example, the type and flow rate of the carrier gas can be controlled, the particle size of the raw material particles can be adjusted, and further, the various conditions that combine these can be controlled to produce the powder.

The term "fine particles" as used herein refers to particles with an average particle size of 5 micrometers (μm) or less as identified by particle size distribution measurement and scanning electron microscope if the primary particles are dense particles, or to particles with an average particle size of 50 micrometers (μm) or less if the primary particles are porous particles that are easily crushed by the impact.

The term "aerosol" as used herein refers to a solid-air mixed phase material formed by dispersing the fine particles described above in gas (carrier gas) such as helium, nitrogen, argon, oxygen, dry air, or mixed gas including these. The term does cover a case where "aggregates" are included, but preferably refers to a state where fine particles are substantially individually dispersed. The gas pressure and temperature of the aerosol may be set as appropriate based on the physical properties of the desired structure. Still, the concentration of the fine particles in the gas at the point of injection from the discharge port is preferably within a range from 0.0003 mL/L to 5 mL/L, with the gas pressure being 1 atm and the temperature being 20° C.

The process of aerosol deposition is usually executed under a normal temperature, and the structure can be formed at a temperature substantially lower than a melting point of the material of the fine particles, that is, several hundred degrees Celsius or lower. The term "normal temperature" as used herein is a temperature much lower than the sintering temperature of ceramics, and refers to a room temperature environment that is substantially in a range from 0 to 100° C. The term "powder" as used herein refers to a state where the fine particles described above are spontaneously aggregated.

EXAMPLES

The present invention is further described with reference to the following Examples, but the present invention is not limited to these Examples.

Raw materials $Y_2O_3$ powders or $Y_2SiO_5$ powders for the structures used in the examples were the powder names F-1 and F-2 shown in Table 1 below.

In the table, the average particle diameter was measured as follows. A laser diffraction particle size distribution analyzer "LA-960/HORIBA" was used to evaluate the particle size distribution after particles were properly dispersed by ultrasound, and the obtained median diameter D50 was used as the average particle diameter.

As shown in Table 1, a plurality of samples including a structure on a base material was prepared, with a combination between these raw materials and a film formation condition (such as the type and the flowrate of the carrier gas) varied. The low-particle generation of the obtained samples after Standard Plasma Tests 1 and 2 was evaluated. In this example, the samples were prepared by aerosol deposition.

TABLE 1

| | Raw materials | | | Manufacture conditions | | Film |
|---|---|---|---|---|---|---|
| Sample No | Powder names | composition | Average particle diameter (μm) | Gas | Flowrate (L/min) | Film thickness (μm) |
| Sample 1 | F-1 | $Y_2O_3$ | 2.04 | He | 10 L/min | 10.1 |
| Sample 2 | F-2 | $Y_2SiO_5$ | 4.88 | $N_2$ | 7 L/min | 9.4 |
| Sample 3 | F-2 | $Y_2SiO_5$ | 4.88 | $N_2$ | 10 L/min | 7.1 |
| Sample 4 | F-2 | $Y_2SiO_5$ | 4.88 | He | 7 L/min | 6.8 |
| Sample 5 | F-2 | $Y_2SiO_5$ | 4.88 | He | 10 L/min | 8.4 |

As illustrated in the table, nitrogen gas ($N_2$) or helium gas (He) is used as the carrier gas. The aerosol was obtained by mixing the carrier gas with material powder (material fine particles) in an aerosol generator. The aerosol thus obtained was injected toward the base material arranged inside a film formation chamber, through a nozzle connected to the aerosol generator, by means of pressure difference. In this process, the air in the film formation chamber has been discharged to the outside by means of a vacuum pump.

Sample

The structures of Samples 1 to 5 obtained as described above each include $Y_2O_3$ or $Y_2SiO_5$ polycrystalline substance as a main component, with the average crystallite size of the polycrystalline substance being less than 30 nm in any of these and he average crystallite size of sample 1 was 12 nm.

The crystallite size was measured using XRD. As the XRD apparatus, "Smart Lab available from Rigaku" was used. The XRD measurement conditions were as follows: CuKα (λ=1.5418 Å) used as characteristic X-ray; tube voltage of 45 kV; tube current of 200 mA; Sampling step of 0.01°; and Scan speed of 10.0°/min. As the average crystallite size, the crystallite size was calculated using the Sheller's formula, with the value of K in the Sheller's formula being 0.94.

The main component of the crystal phase of the $Y_2SiO_5$ on the base material was measured by XRD. As the XRD apparatus, "Smart Lab available from Rigaku" was used. The XRD measurement conditions were as follows: CuKα (λ=1.5418 Å) used as characteristic X-ray; tube voltage of 45 kV; tube current of 200 mA; Sampling step of 0.01°; and Scan speed of 10.0°/min. The main component was calculated using XRD analysis software "Smart Lab Studio II available from Rigaku" and the ratio of each crystalline phase was calculated by Rietveld analysis. For the measurement of the main component of the polycrystal in a case of laminated structure, a measurement result for a region at a depth that is less than 1 μm from the outermost surface, obtained by thin film XRD is preferably used.

Test Evaluation

For samples 1 to 5 obtained as described above, the following lattice constant, indentation hardness, etching rate, arithmetic mean height Sa after plasma irradiation, and fluoride amount were measured. In addition, the Standard Plasma Tests were conducted as follows.

Measurement of Lattice Constant

The lattice constant of the $Y_2SiO_5$ was evaluated by XRD in the following procedure. The XRD device used was "Smart Lab/available from Rigaku". The XRD measurement conditions were: characteristic X-rays CuKα (λ=1.5418 Å), tube voltage 45 kV, tube current 200 mA, sampling step 0.01°, and scan speed 10.0°/min. The XRD analysis software "SmartLab Studio II/available from Rigaku" was used to identify the obtained XRD diffraction pattern as a monoclinic crystal of the chemical formula $Y_2SiO_5$ shown in ICDD card 01-070-5613. Next, the lattice constant is calculated by lattice constant refinement using the external standard method using the XRD analysis software "SmartLab Studio II/available from Rigaku". Metallic Si is used as the external standard. In addition, as peaks to be used for calculating the lattice constant, a peak at a diffraction angle 2θ=16.4° assigned to Miller indices (hkl)=(110), a peak at a diffraction angle 2θ=20.6° assigned to Miller indices (hkl) =(200), a peak at a diffraction angle 2θ=31.1° assigned to Miller indices (hkl)=(300), a peak at a diffraction angle 2θ=32.5° assigned to Miller indices (hkl)=(121), a peak at a diffraction angle 2θ=33.7° assigned to Miller indices (hkl) =(310), a peak at a diffraction angle 2θ=46.3° assigned to Miller indices (hkl)=(321), and a peak at a diffraction angle 2θ=48.8° assigned to Miller indices (hkl)=(−123) were specified. In addition, since the structure of the present invention is a new structure having lattice constants a=9.0139 and c=6.6427, the peak positions (2θ) assigned to each Miller index (hkl) actually measured by XRD are shifted to a lower angle side by 0.1 to 0.4° from the theoretical peak positions (2θ) assigned to each Miller index (hkl), the measurement of the lattice constants is in accordance with JIS K0131.

Peak Intensity Ratio Measurement

The peak intensity ratio of the structure was evaluated using XRD in the following manner. The XRD device used was "Smart Lab/available from Rigaku". The XRD measurement conditions were: characteristic X-rays CuKα (λ=1.5418 Å), tube voltage 45 kV, tube current 200 mA, sampling step 0.01°, and scan speed 10.0°/min. The peak intensity ratio was calculated as γ=β/α, with the peak intensity at a diffraction angle) 2θ=32.5°±0.4° (32.1°-32.9°) assigned to Miller index (hkl)=(121) in the monoclinic crystal of $Y_2SiO_5$ being α, and the peak intensity at a diffraction angle 2θ=31.1°±0.4°(30.7°-31.5° assigned to Miller index (hkl)=(300) being β. In addition, since the structure in the present invention is a novel structure having lattice constants a=9.0139 and c=6.6427, the peak positions (2θ) assigned to each Miller index (hkl) actually measured by XRD are shifted to a lower angle side by 0.1 to 0.40 from the theoretical peak positions (2θ) assigned to each Miller index (hkl).

Indentation Hardness Measurement

The indentation hardness of the structure on the substrate was evaluated by the ultra-microindentation hardness test (nanoindentation) in the following procedure. An "ENT-2100/available from Elionix" was used as the ultra-micro-indentation hardness tester (nanoindenter). The conditions for the ultra-microindentation hardness test were a Berkovich indenter, the test mode was an indentation depth setting test, and the indentation depth was 200 nm. The indentation hardness (indentation hardness) HIT was measured. The measurement points for HIT were set randomly on the surface of the structure, and the number of measurement points was at least 25 points. The average value of the measured HITs at 25 points or more was taken as the hardness.

Standard Plasma Test

Standard Plasma Tests 1 and 2 under the conditions described above were performed on the samples above, and the low-particle generation after the tests was evaluated through the following procedure. As an ICP-RIE apparatus, "Muc-21 Rv-Aps-Se/available from Sumitomo Precision Products" was used. Standard Plasma Tests 1 and 2 were performed also under the common conditions that chamber pressure is 0.5 Pa and plasma exposure time is one hour. The samples were arranged on the silicon wafer sucked by an electrostatic chuck of the ICP-RIE apparatus to expose the structure surface to the plasma atmosphere formed under such conditions.

Etching Rate

The etching rate (e) of the structure after Standard Plasma Test 1 was measured using a laser microscope, and a level difference (d) between the non-plasma exposed area and the exposed area was measured using a scanning laser microscope (LEXT OLS-4000, manufactured by Olympus Corporation) and calculated from the plasma exposure time (t) using e=d/t. The plasma non-exposed area was formed by partially masking the surface of the structure with a polyimide film before the Standard Plasma Test 1.

Arithmetic Mean Height Sa after Plasma Irradiation

Regarding the surface roughness of the structure after Standard Plasma Test 1, Sa (arithmetic mean height) defined in ISO25178 was evaluated using a laser microscope. The laser microscope used was "OLS4500/manufactured by Olympus Corporation." The objective lens used was MPLAPON 100XLEXT, and the cutoff value λc was set to 25 μm.

Fluoride Amount

The surface of the structure after Standard Plasma Test 2 was analyzed using X-ray photoelectron spectroscopy (XPS) in the depth direction using ion sputtering; at every interval, the atomic concentration (%) of fluorine (F) atoms was measured. "K-Alpha/manufactured by Thermo Fisher Scientific" was used as the XPS device. All the obtained atomic concentrations (%) of fluorine (F) atoms every second from 5 seconds to 149 seconds of sputtering time were integrated, and this was taken as the integrated amount of fluoride (%) on the surface of the structure. In addition, in order to eliminate the influence of carbon (C) adhering to the surface layer as contamination, data for sputtering times of 0 seconds to 5 seconds were not included.

The test results are as shown in the table below.

TABLE 2

| Sample No | Lattice constant a (Å) | Lattice constant b (Å) | Lattice constant c (Å) | Hardness (GPa) | peak intensity ratio (300)/(121) | Sa after plasma irradiation (μm) | Etching rate (μm/hr) | Fluoride amount (at %@ 145 s) |
|---|---|---|---|---|---|---|---|---|
| ICDD card Y2(SiO4)O | 9.01 | 6.93 | 6.64 | — | 69% | — | — | — |
| Sample 1 | — | — | — | — | — | 0.02 | 1.1 | 1316 |
| Sample 2 | 9.04 | 6.89 | 6.70 | 4.1 | 86% | 0.23 | 1.6 | 3624 |
| Sample 3 | 9.06 | 6.91 | 6.68 | 6.4 | 100% | 0.12 | 1.6 | 2356 |
| Sample 4 | 9.11 | 6.96 | 6.74 | 10.7 | 111% | 0.06 | 1.3 | 1001 |
| Sample 5 | 9.10 | 9.94 | 6.73 | 10.5 | 110% | 0.03 | 1.5 | 742 |

Figure 2A:
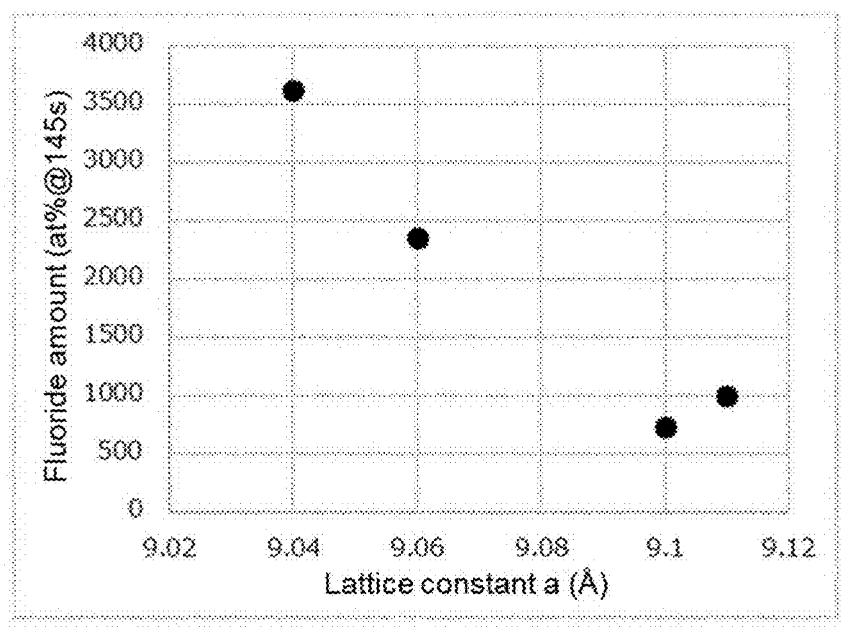
FIG. 2A-2C are graphs showing the relationship between lattice constant and amount of fluorination of structures according to the present invention.
Figure 2B:
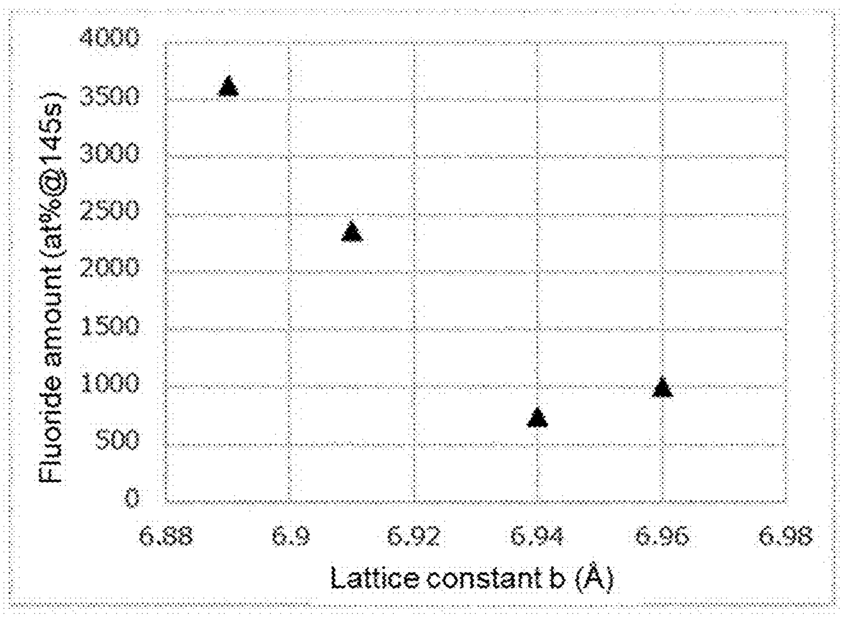
Figure 2C:
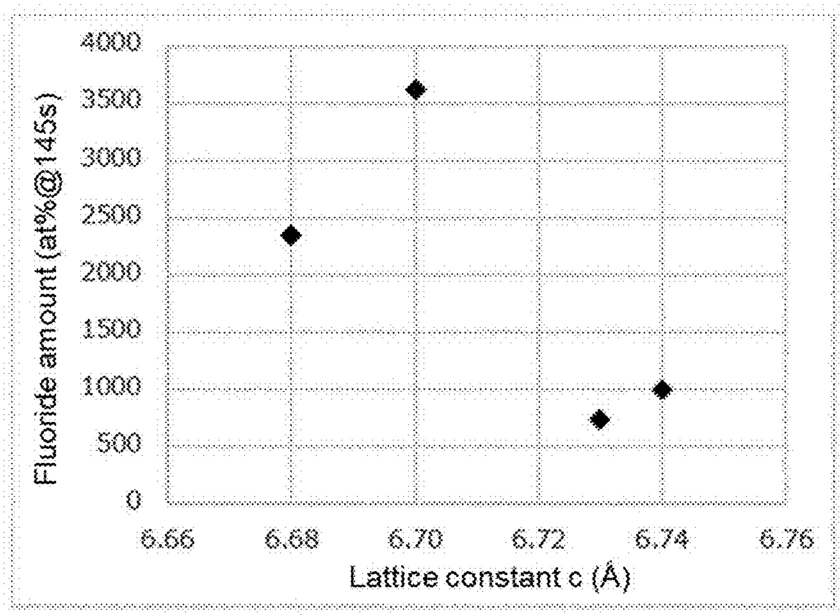
Figure 3A:
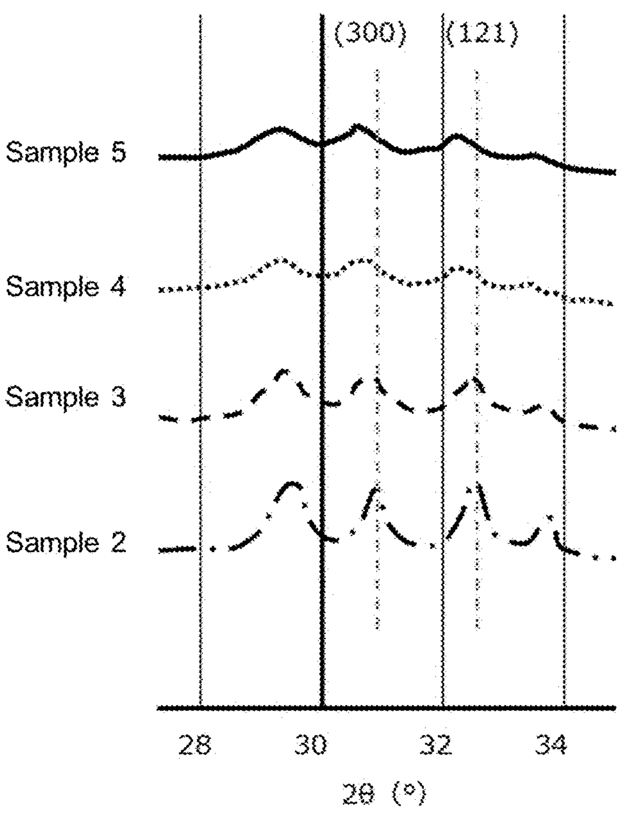
FIG. 3A is a graph showing the intensity of X-ray diffraction data of a structure according to the present invention.
Figure 3B:
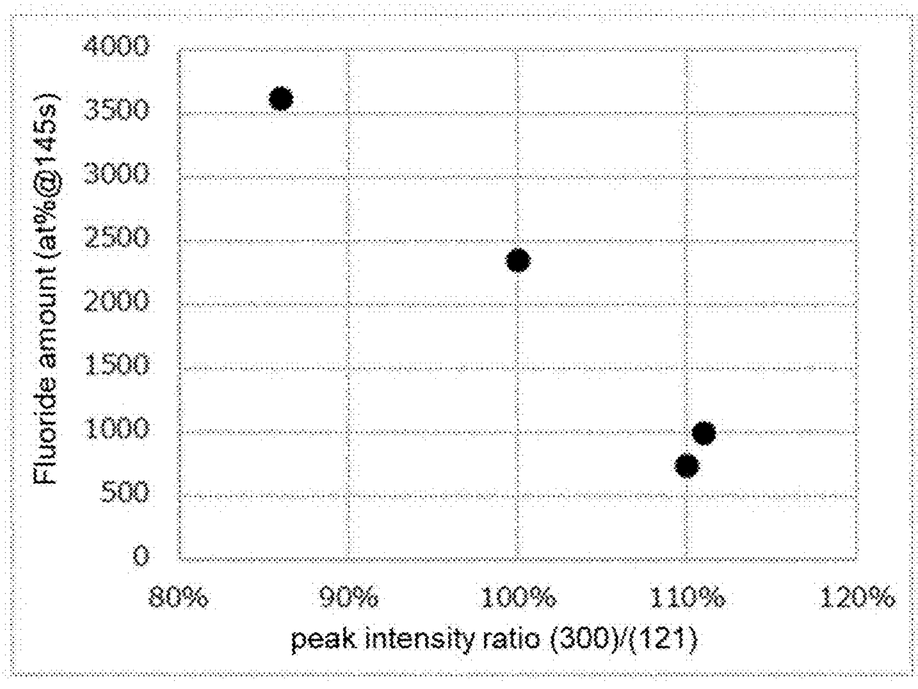
FIG. 3B is a graph showing the relationship between peak intensity ratio and fluorination amount of the structure according to the present invention.
Figure 4:
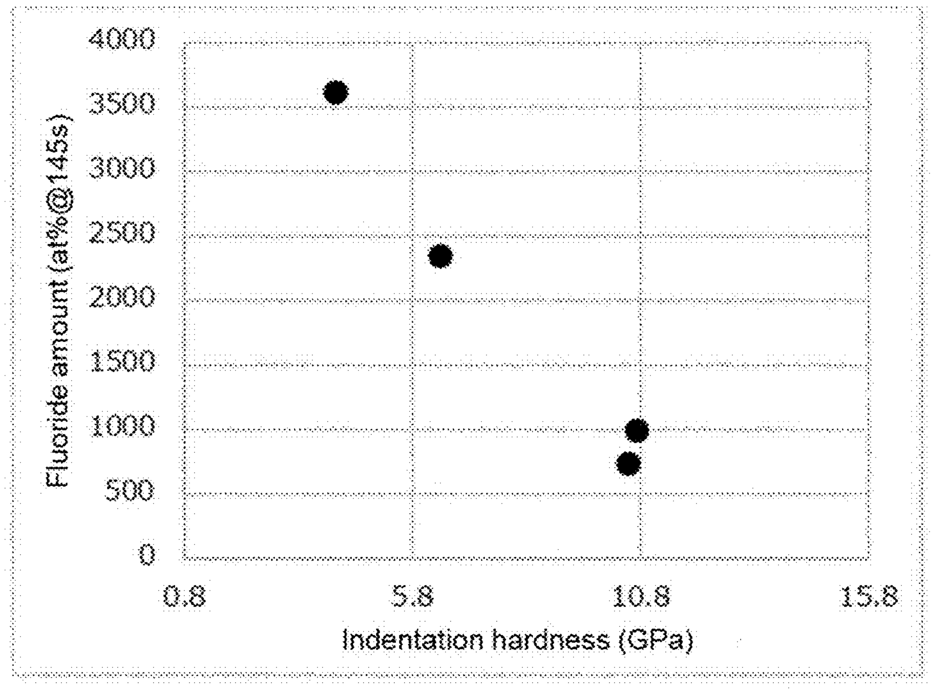
FIG. 4 is a graph showing the relationship between indentation hardness and fluorination amount of structures according to the present invention.

The relation between the lattice constant value and the fluoride amount is shown in FIGS. 2*a* to 2*c*. FIG. 3*a* is a graph showing the intensity of X-ray diffraction data, and the relationship between the peak intensity ratio and the fluorination amount is shown in FIG. 3*b*. The relationship between the indentation hardness and the amount of fluorination is shown in FIG. 4.

SEM Image

SEM images of the surface of the structure after Standard Plasma Tests 1 and 2 were taken as follows. A scanning electron microscope (SEM) was used to evaluate the corrosion state of the plasma-exposed surface. The SEM used was "SU-8220/manufactured by Hitachi, Ltd." The acceleration voltage was 3 kV. The resulting photographs are shown in FIG. 5.

The embodiments of the present invention are described above. However, the present invention is not limited to the description thereof. Modes as a result of design change on the embodiments described above by a person skilled in the art are also included in the scope of the present invention as long as the modes have the features of the present invention. For example, the shape, dimension, material, arrangement, of the structure or the base material are not limited to those exemplified, and can be changed as appropriate. The elements of the embodiments described above can be combined as long as such combinations are technically reasonable. The combinations are included in the scope of the present invention as long as the combinations have the features of the present invention.

What is claimed is:

1. A composite structure comprising: a base material; and a structure provided on the base material and has a surface, wherein the structure comprises $Y_2SiO_5$ crystal as a main component and lattice constants of the crystal satisfy at least one of a>9.06 Å, b>6.93 Å, and c>6.70 Å.

2. The composite structure according to claim 1, wherein the lattice constants satisfy at least one of a>9.10 Å, b>6.94 Å, and c>6.73 Å.

3. The composite structure according to claim 1, wherein the structure comprises 70 wt % or more of $Y_2SiO_5$.

4. The composite structure according to claim 1, wherein the structure comprises 90 wt % or more of $Y_2SiO_5$.

5. The composite structure according to claim 1, wherein the structure consisting substantially of $Y_2SiO_5$.

6. The composite structure according to claim 1, wherein an average crystallite size of $Y_2SiO_5$ in the structure is less than 50 nm.

7. The composite structure according to claim 1, wherein after Standard Plasma Test 1, the surface roughness Sa, determined according to ISO 25178, of the structure is less than 0.06 μm.

8. The composite structure according to claim 1 used in an environment requiring low-particle generation.

9. The composite structure according to claim 8 that is a member for a semiconductor manufacturing apparatus.

10. A composite structure comprising: a base material; and a structure provided on the base material and has a surface, wherein the structure comprises $Y_2SiO_5$ crystal as a main component, and an peak intensity ratio (300)/(121) which is the ratio of (300) peak to (121) peak in X-ray diffraction of the crystal, is greater than 100%.

11. The composite structure according to claim 10, wherein the peak intensity ratio (300)/(121) is greater than 110%.

12. The composite structure according to claim 10, wherein the structure comprises 70 wt % or more of $Y_2SiO_5$.

13. The composite structure according to claim 10, wherein the structure comprises 90 wt % or more of $Y_2SiO_5$.

14. The composite structure according to claim 10, wherein the structure consisting substantially of $Y_2SiO_5$.

15. The composite structure according to claim 10, wherein an average crystallite size of $Y_2SiO_5$ in the structure is less than 50 nm.

16. The composite structure according to claim 10, wherein after Standard Plasma Test 1, the surface roughness Sa, determined according to ISO 25178 of the structure is less than 0.06 μm.

17. The composite structure according to claim 10 used in an environment requiring low-particle generation.

18. The composite structure according to claim 17 that is a member for a semiconductor manufacturing apparatus.

19. A composite structure comprising: a base material; and a structure provided on the base material and has a surface, wherein the structure comprises $Y_2SiO_5$ crystal as a main component, and has an indentation hardness of more than 7.5 GPa.

20. The composite structure according to claim 19, wherein the indentation hardness of more than 10 GPa.

* * * * *